United States Patent
Han et al.

(10) Patent No.: US 12,266,533 B2
(45) Date of Patent: Apr. 1, 2025

(54) SACRIFICIAL CAPPING LAYER FOR CONTACT ETCH

(71) Applicant: TOKYO ELECTRON LIMITED, Tokyo (JP)

(72) Inventors: Yun Han, Albany, NY (US); Andrew Metz, Albany, NY (US); Peter Biolsi, New Windsor, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/721,620

(22) Filed: Apr. 15, 2022

(65) Prior Publication Data

US 2022/0384199 A1 Dec. 1, 2022

Related U.S. Application Data (60) Provisional application No. 63/195,436, filed on Jun. 1, 2021.

(51) Int. Cl.
| | |
|---|---|
| *H01L 21/306* | (2006.01) |
| *H01L 21/02* | (2006.01) |
| *H01L 21/3065* | (2006.01) |
| *H01L 21/311* | (2006.01) |
| *H01L 21/768* | (2006.01) |
| *H01L 29/66* | (2006.01) |

(52) U.S. Cl.
CPC .... *H01L 21/3065* (2013.01); *H01L 21/02164* (2013.01); *H01L 21/31138* (2013.01); *H01L 21/76829* (2013.01); *H01L 29/66795* (2013.01)

(58) Field of Classification Search
CPC ........... H01L 21/3065; H01L 21/02164; H01L 21/31138; H01L 21/76829; H01L 29/66795; H01L 2221/1063; H01L 21/76897; H01L 29/165; H01L 29/66545; H01L 29/7848; H01L 21/31116
USPC .................................................. 438/706–714
See application file for complete search history.

(56) References Cited

U.S. PATENT DOCUMENTS

| | | | |
|---|---|---|---|
| 10,134,600 | B2 | 11/2018 | Romm et al. |
| 10,269,648 | B1* | 4/2019 | Li .................... H01L 29/66795 |
| 10,804,398 | B2 | 10/2020 | Frougier et al. |
| 10,818,507 | B2 | 10/2020 | Sherpa et al. |
| 10,923,595 | B2 | 2/2021 | Peng et al. |
| 11,211,492 | B2 | 12/2021 | Peng et al. |
| 2018/0226260 | A1 | 8/2018 | Romm et al. |
| 2019/0165174 | A1 | 5/2019 | Peng et al. |

(Continued)

FOREIGN PATENT DOCUMENTS

| | | |
|---|---|---|
| JP | 2020-155603 A | 9/2020 |
| KR | 10-2019-0107159 A | 9/2019 |

OTHER PUBLICATIONS

International Search Report and Written Opinion issued Aug. 12, 2022 in PCT/US2022/026455, 9 pages.

*Primary Examiner* — Duy Vu N Deo
(74) *Attorney, Agent, or Firm* — Oblon, McClelland, Maier & Neustadt, L.L.P.

(57) ABSTRACT

A method which includes providing a substrate having a source/drain region and an etch stop layer on the source/drain region. A plasma etching process is performed using an etching gas that removes the etch stop layer and forms a sacrificial oxide capping layer on the source/drain region. The sacrificial oxide capping layer is then from the source/drain region.

20 Claims, 8 Drawing Sheets

(56) References Cited

U.S. PATENT DOCUMENTS

| 2019/0348295 | A1 | 11/2019 | Sherpa et al. |
| 2020/0044085 | A1 | 2/2020 | Peng et al. |
| 2020/0119180 | A1 | 4/2020 | Frougier et al. |
| 2022/0262792 | A1* | 8/2022 | Wu .................. H01L 29/66545 |

* cited by examiner

SACRIFICIAL CAPPING LAYER FOR CONTACT ETCH

CROSS-REFERENCE TO RELATED APPLICATIONS

The present disclosure claims the benefit of U.S. Provisional Application No. 63/195,436 filed Jun. 1, 2021, which is incorporated herein by reference in its entirety.

TECHNICAL FIELD

The present invention relates generally to semiconductor device fabrication, and more particularly, to methods for forming a sacrificial capping layer for contact etch.

BACKGROUND

Advancement in semiconductor technologies relies on continued improvement in manufacturing fabrication technology. Innovation in semiconductor technologies has resulted in the introduction of new types of structures such as FinFET devices and stacked structures (e.g., 3D NAND devices). However, these new structures introduce a need for new fabrication schemes to overcome, what would otherwise be, debilitating manufacturing challenges. For instance, a dry etch process such as reactive ion etching (RIE) may be used to open contacts within traditional middle-of-line (MOL) process flow. Often, the dry etch process can be quite aggressive for some layers within a semiconductor process flow. Typically, the dry etch process possesses a plasma source that generates a sea of ions that accelerate in a manner that causes ion bombardment against sensitive device layers. Resultantly, the plasma etch processes may cause damage to the underlying material and can then lead to uncontrolled variations in device electrical performance, as well as yield loss.

SUMMARY

The present disclosure relates to a semiconductor device, and a method of manufacturing a semiconductor device.

An aspect (1) provides a method which includes providing a substrate having a source/drain region and an etch stop layer on the source/drain region. A plasma etching process is performed using an etching gas that removes the etch stop layer and forms a sacrificial oxide capping layer on the source/drain region. The sacrificial oxide capping layer is then from the source/drain region.

An aspect (2) includes the method of aspect (1), wherein the substrate includes a metal gate stack separated from the source/drain region by a spacer, and the etch stop layer is a conformal layer having a first portion covering the source/drain region and a second portion covering the spacer and the metal gate stack.

An aspect (3) includes the method of aspect (2), wherein the performing a plasma etching process includes completely removing the first portion of the etch stop layer to expose the source/drain region before completely removing the second portion of the etch stop layer. The sacrificial oxide capping layer is formed on the exposed source/drain region while completely removing the second portion of the etch stop layer.

An aspect (4) includes the method of aspect (1), wherein the source/drain region contains Si, Ge, or both Si and Ge.

An aspect (5) includes the method of aspect (1), wherein the performing a plasma etching process includes forming a sacrificial oxide capping layer including $SiO_2$, $GeO_2$, or $SiGeO_x$.

An aspect (6) includes the method of aspect (1), wherein the etch stop layer contains a nitride layer.

An aspect (7) includes the method of aspect (1), wherein the etch stop layer contains SiN.

An aspect (8) includes the method of aspect (1), wherein the performing a plasma etching process includes using an etching gas including a fluorocarbon-containing gas and an oxygen-containing gas.

An aspect (9) includes the method of aspect (8), wherein the fluorocarbon-containing gas includes a fluorocarbon gas, a hydrofluorocarbon gas, or a combination thereof.

An aspect (10) includes the method of aspect (8), wherein the oxygen-containing gas includes $O_2$, $O_3$, $CO$, $CO_2$, $SO_2$, or a combination thereof.

An aspect (11) includes the method of aspect (1), wherein the removing the sacrificial capping layer includes performing a wet etch process on the substrate.

An aspect (12) includes the method of aspect (1), wherein the removing the sacrificial capping layer performing a dry etch process on the substrate.

Another aspect (13) provides a method which includes providing a substrate including a source/drain region and a SiN etch stop layer on the source/drain region, the source/drain region containing Si, Ge, or both Si and Ge. A plasma etching process is performed using an etching gas containing a fluorocarbon-containing gas and an oxygen-containing gas that removes the SiN etch stop layer and forms a sacrificial oxide capping layer on the source/drain region. The sacrificial oxide capping layer is removed from the source/drain region using a wet or dry etch process.

An aspect (14) includes the method of aspect (13), wherein the substrate includes a metal gate stack separated from the source/drain region by a spacer, and the SiN etch stop layer is a conformal layer having a first portion covering the source/drain region and a second portion covering the spacer and the metal gate stack.

An aspect (15) includes the method of aspect (14), wherein the performing a plasma etching process includes completely removing the first portion of the etch stop layer to expose the source/drain region before completely removing the second portion of the etch stop layer. The sacrificial oxide capping layer is formed on the exposed source/drain region while completely removing the second portion of the etch stop layer.

An aspect (16) includes the method of aspect (13), wherein the sacrificial oxide capping layer contains $SiO_2$, $GeO_2$, or $SiGeO_x$.

An aspect (17) includes the method of aspect (13), wherein the fluorocarbon-containing gas includes a fluorocarbon gas, a hydrofluorocarbon gas, or a combination thereof.

An aspect (18) includes the method of aspect (13), wherein the oxygen-containing gas includes $O_2$, $O_3$, $CO$, $CO_2$, $SO_2$, or a combination thereof.

Another aspect (19) provides a method which includes providing a substrate including a source/drain region and a SiN etch stop layer on the source/drain region, the source/drain region containing Si, Ge, or both Si and Ge. A plasma etching process is performed using an etching gas containing $CH_3F$ gas and $O_2$ gas that removes the SiN etch stop layer and forms a sacrificial oxide capping layer on the source/drain region, the sacrificial oxide capping layer containing SiO$_2$, GeO2, or SiGeOx. The sacrificial oxide capping layer is removed from the source/drain region using a wet or dry etch process.

An aspect (20) includes the method of aspect (19), wherein the substrate includes a metal gate stack separated from the source/drain region by a spacer, and the SiN etch stop layer is a conformal layer having a first portion covering the source/drain region and a second portion covering the spacer and the metal gate stack. The performing a plasma etching process includes completely removing the first portion of the etch stop layer to expose the source/drain region before completely removing the second portion of the etch stop layer. The sacrificial oxide capping layer is formed on the exposed source/drain region while completely removing the second portion of the etch stop layer.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION OF ILLUSTRATIVE EMBODIMENTS

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As noted in the Background section above, damage to epitaxial source/drain materials induced by contact open etch is one of MOL challenges in fabrication of FinFETs for logic ICs. This kind of damage leads to uncontrolled variations in device electrical performance. Embodiments of the invention provide a novel approach for protecting epitaxial source/rain materials from damage by in-situ formation of a thin sacrificial capping layer on the epitaxial source/rain materials during contact open etch. Subsequently, the sacrificial capping layer may be removed using gentle processing that does not damage epitaxial source/rain materials and provides high etch selectivity between the sacrificial capping layer and the epitaxial source/rain materials.

Embodiments of the present application disclose a method for preventing damage to semiconductor regions during plasma etching. The proposed integration scheme uses a sacrificial capping layer formed directly on top of a semiconductor region to be protected. This sacrificial capping layer is designed to protect the semiconductor region during the plasma etching process that would otherwise damage the semiconductor region. This sacrificial capping layer may be removed later in the process using a gentle dry or wet clean process.

Embodiments of the application may be applied to various types of devices such as Fin transistors as well as stacked memory devices. Specific embodiments of the above process will be described below.

Figure 1A:
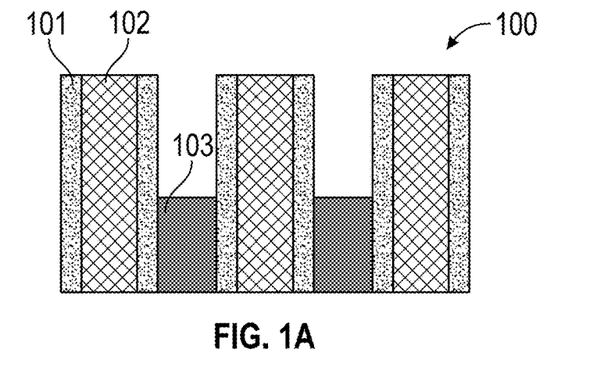
FIG. 1A illustrates a partial cross sectional fin view of a semiconductor device during fabrication along a direction of a fin.
Figure 1B:
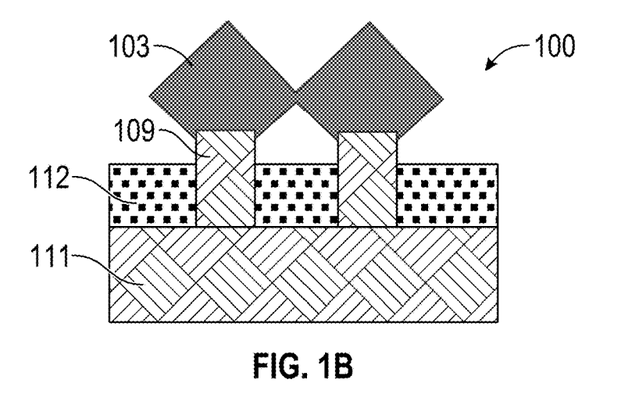
FIG. 1B shows a cross sectional gate view of the semiconductor device along a direction orthogonal to the direction of the fin, and in accordance with an example embodiment of the present disclosure.
Figure 1C:
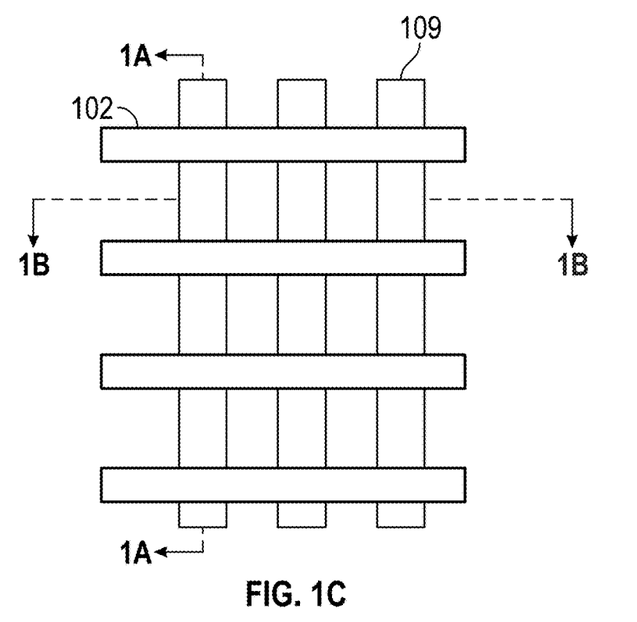
FIG. 1C illustrates a top view of the semiconductor in accordance with an example embodiment of the present disclosure.

FIG. 1A illustrates a partial cross sectional view of a semiconductor device during fabrication along a direction of a fin, wherein FIG. 1B shows a cross sectional view of the semiconductor device along a direction orthogonal to the direction of the fin, and wherein FIG. 1C illustrates a top view showing the cutline 1A-1A illustrated in FIG. 1A and cutline 1B-1B illustrated in FIG. 1B, all in accordance with an embodiment of the present invention. FIG. 1A is a partial cross sectional view and does not show the underlying fins and substrate.

As illustrated in FIGS. 1A-1C, at this stage of processing, the semiconductor device 100 has already gone through a substantial part of the front-end-of-the-line (FEOL) fabrication. For example, as illustrated in FIG. 1B, a transistor structure with a plurality of fins 109 is formed on the substrate 111.

In various embodiments, the substrate 111 may comprise silicon, silicon germanium, silicon carbide, and compound semiconductors such as gallium nitride, gallium arsenide, indium arsenide, indium phosphide, and others. The substrate 111 may comprise a semiconductor wafer that may include a semiconductor epitaxial layer including hetero epitaxial layers. For example, in one or more embodiments, one or more hetero epitaxial layers comprising a compound semiconductor may be formed over a semiconductor substrate. In various embodiments, a portion or an entirety of the substrate 111 may be amorphous, polycrystalline, or single-crystalline. In various embodiments, the substrate 111 may be doped, undoped, or contain both doped and undoped regions.

The plurality of fins 109 may be formed by epitaxial growth from the substrate 111 or alternatively using an etch back process leaving the plurality of fins 109. The plurality of fins 109 may be isolated from each other by shallow isolation regions 112. Accordingly, the shallow isolation regions 112 and the plurality of fins 109 may form an alternating pattern.

In one embodiment, the shallow isolation regions 112 may be formed by depositing an oxide fill material after patterning the plurality of fins 109, which is then planarized, for example, using a chemical mechanical planarization process. After a planarization, the shallow isolation regions 112 may be recessed so as to raise the plurality of fins 109.

A plurality of dummy gates 102 are formed over the substrate 111 and the plurality of fins 109. In one embodiment, the plurality of dummy gates 102 may be formed by patterning a layer of amorphous silicon or polysilicon deposited over the plurality of fins 109.

Next, a plurality of spacers 101 are formed on sidewalls of the plurality of dummy gates 102. The plurality of spacers 101 can be formed by depositing an insulating layer followed by an anisotropic etching process. For example, a reactive ion etch (RIE) process may be used to form the spacers 101. The material of the insulating layer is chosen to be selectively not etched during the removal of the plurality of dummy gates 102 later in the process, e.g., immune to etching by chemical such as TMAH or NH$_4$OH. In one example, the spacers 101 can contain a low-k material.

Next, epitaxial regions 103 are grown over portions of the plurality of fins 109 located between the plurality of dummy gates 102 so as to form raised source/drain regions. As depicted, the upper surface of the raised source/drain regions may form a faceted surface due to the growth pattern of the corresponding epitaxial material. In some embodiments, the source/drain regions contain Si, Ge, or both Si and Ge.

In one or more embodiments, the epitaxial regions 103 may be formed in a single epitaxial growth process. In other embodiments, the growth of the epitaxial regions 103 may consist of a multi-stage process. For example, it can begin with growing an initial epitaxial layer with a first doping on the plurality of fins 109 to a pre-determined thickness followed by the growth of a second layer with a second doping. For example, the second doping may be higher than the first doping. Similarly, the different layer may have different compositions of e.g., germanium or other compounds. The epitaxial growth process may use any type of epitaxial process including molecular beam epitaxy (MBE), or various types of chemical vapor deposition (CVD).

In one or more embodiments, the epitaxial regions 103 may be grown to introduce strain into the plurality of fins 109, for example, due to lattice mismatch.

In one or more embodiments, the source/drain (S/D) regions may be formed by doping the regions of the fins and the epitaxial regions 103, for example, with an implantation/anneal process.

Figure 2A:
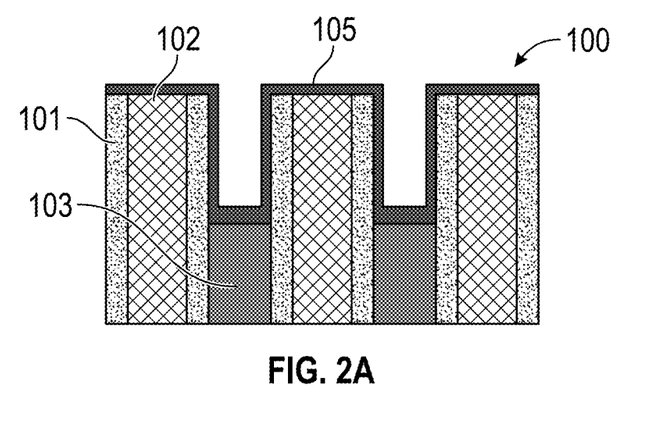
FIGS. 2A-2B illustrate cross sectional fin and gate views respectively of the semiconductor device during a subsequent stage of fabrication, in accordance with an example embodiment of the present disclosure.
Figure 2B:
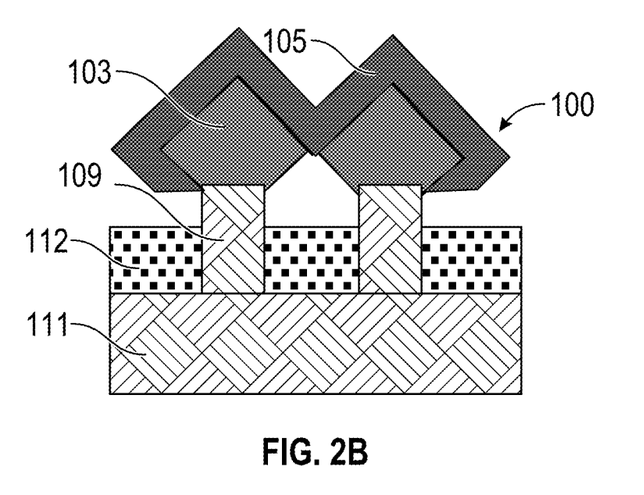

FIGS. 2A-2B illustrate a cross sectional view of the semiconductor device 100, during a subsequent stage of fabrication, after forming a etch stop layer (ESL) 105 over the semiconductor device 100. FIG. 2A illustrates a cutline similar to FIG. 1A while FIG. 2B illustrates a cutline similar to FIG. 1B.

The ESL 105 may be conformally deposited across the entire wafer surface. In various embodiments, the ESL 105 comprises silicon nitride (SiN) or silicon oxynitride (SiON). In various embodiments, the ESL 105 may have a thickness ranging from 0.5 nm to about 10 nm. In one embodiment, the ESL 105 may have a thickness ranging from 2 nm to about 5 nm.

Figure 3A:
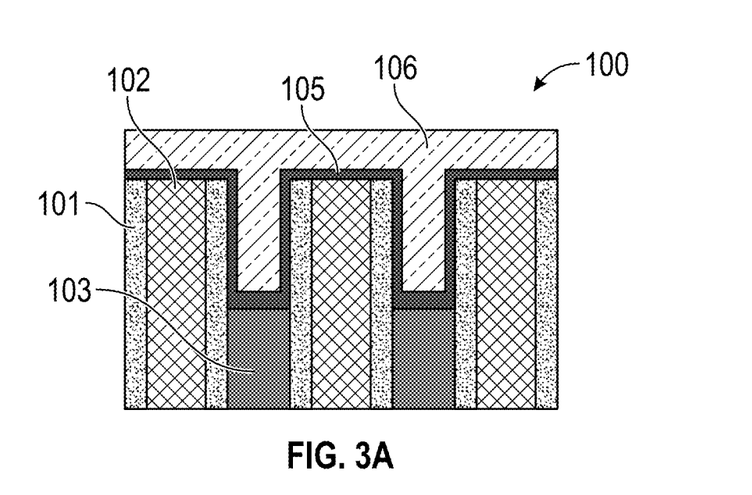
FIGS. 3A-3B illustrate cross sectional fin and gate views respectively of the semiconductor device during a subsequent stage of fabrication, in accordance with an example embodiment of the present disclosure.
Figure 3B:
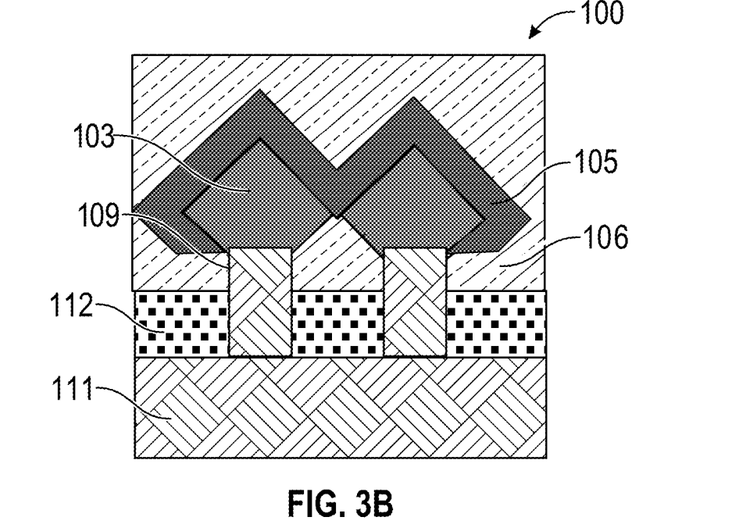

FIGS. 3A-3B illustrate partial cross sectional views of the semiconductor device 100 during fabrication after depositing an oxide 106 in accordance with an embodiment of the present invention. FIG. 3A illustrates a cutline similar to FIG. 1A while FIG. 3B illustrates a cutline similar to FIG. 1B.

Referring to FIGS. 3A and 3B, the oxide 106 is filled between the plurality of dummy gates 102. The oxide 106 is overfilled above the top surface of the ESL 105 and over the plurality of dummy gates 102.

In various embodiments of semiconductor device 100, the oxide 106 may be a flowable oxide including spin-on-glass. In one example, a layer comprising borophosphosilicate glass (BPSG), phosphosilicate glass (PSG), borosilicate glass (BSG), arsenic-silicon glass (ArSG), or other types of glass may be deposited and heated to reflow. In one or more embodiments, the oxide 106 may also comprise an oxide such as tetra ethyl oxysilane (TEOS), fluorinated TEOS (FTEOS), organo silicate glass (OSG), fluorinated silicate glass (FSG), or a spin-on glass (SOG).

Figure 4A:
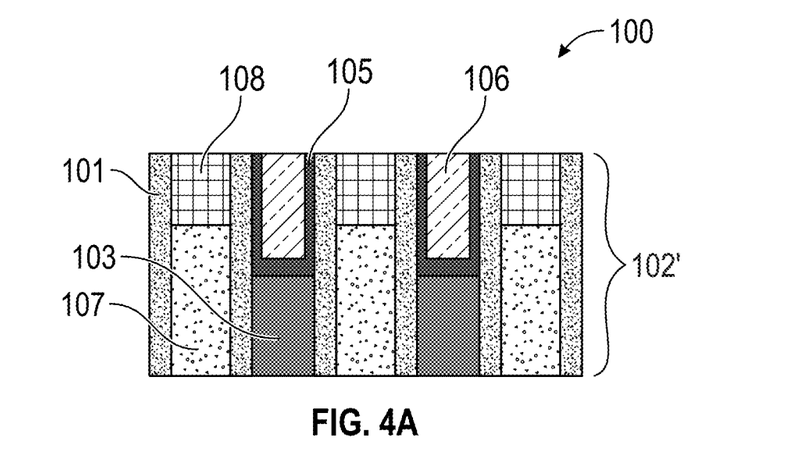
FIGS. 4A-4B illustrate cross sectional fin and gate views respectively of the semiconductor device during a subsequent stage of fabrication, in accordance with an example embodiment of the present disclosure.
Figure 4B:
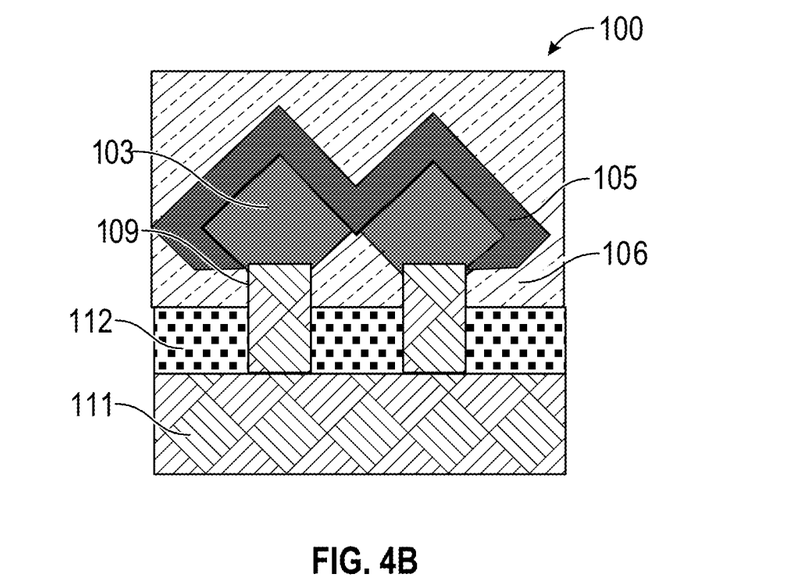

FIGS. 4A-4B illustrate a cross sectional view of the semiconductor device 100 during fabrication after forming a replacement metal gate (RMG) in accordance with an embodiment of the invention. FIG. 4A illustrates a cutline similar to FIG. 1A while FIG. 4B illustrates a cutline similar to FIG. 1B.

As illustrated in FIGS. 4A and 4B, the oxide 106 is planarized to expose the underlying ESL 105. The ESL 105 may be removed using an anisotropic etching process to expose the plurality of dummy gates 102. The plurality of dummy gates 102 is then removed, e.g., using a wet etch process or alternatively a plasma process. The spacer 101 retains the shape of the gate stack during the removal of the plurality of dummy gates 102. During the etching process, the oxide 106 protects the underlying regions of the epitaxial region 103.

After removing the plurality of dummy gates 102, the inner sidewalls of the plurality of spacers 101 are exposed leaving a cavity. This cavity is filled with a replacement gate material 107. After the replacement gate material 107 is in place, a contact cap 108 is formed. The contact cap 108 may be formed using a self-aligned process so as to form selectively only over the replacement gate material 107.

The replacement gate material 107 along with the contact cap 108 form the replacement metal gate (RMG) stack 102'. The RMG stack 102' helps to set the work function of the gate and forms the final gate electrode of the semiconductor device 100.

Figure 5A:
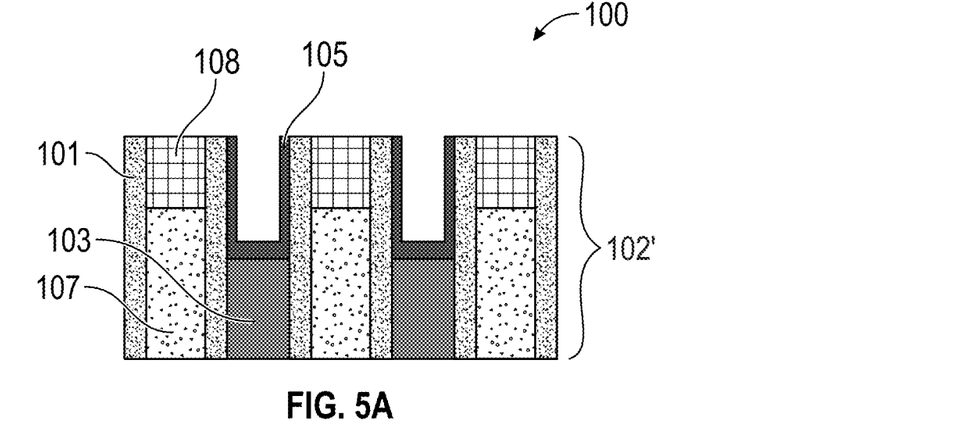
FIGS. 5A-5B illustrate cross sectional fin and gate views respectively of the semiconductor device during a subsequent stage of fabrication, in accordance with an example embodiment of the present disclosure.
Figure 5B:
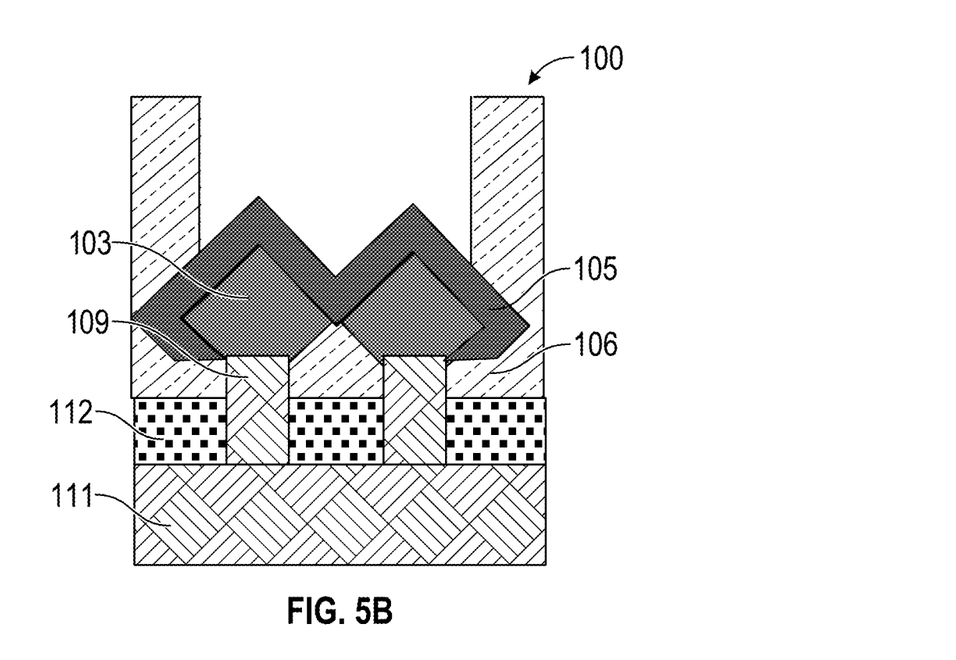

FIGS. 5A-5B illustrate partial cross sectional views of the semiconductor device 100 during a next stage of fabrication, after etching of the oxide 106, in accordance with an embodiment of the present invention. FIG. 5A illustrates a cutline similar to FIG. 1A while FIG. 5B illustrates a cutline similar to FIG. 1B.

As illustrated in FIG. 5A, the etching of the oxide 106 leaves empty, unfilled trenches or recessed features behind. In various embodiments, the oxide etch process may be a wet etch process, or a dry etch process such as reactive ion etch (RIE), or any process currently known within the art of semiconductor manufacturing. Etching the oxide 106 exposes the ESL 105 remaining between the plurality of spacers 101 that line the replacement gate material 107 and the contact cap 108.

Figure 6A:
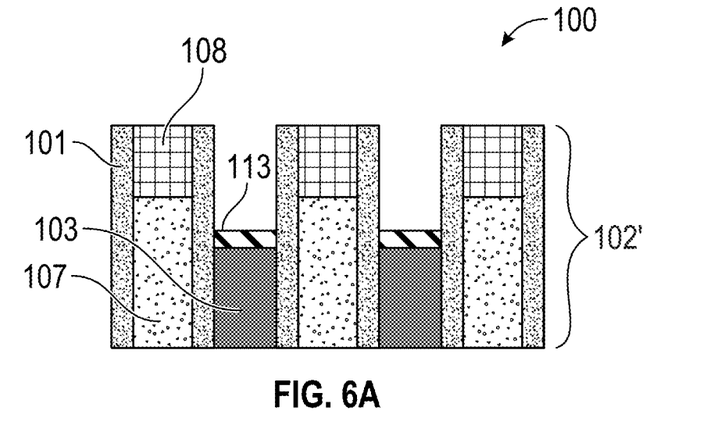
FIGS. 6A-6B illustrate cross sectional fin and gate views respectively of the semiconductor device during a subsequent stage of fabrication, in accordance with an example embodiment of the present disclosure.
Figure 6B:
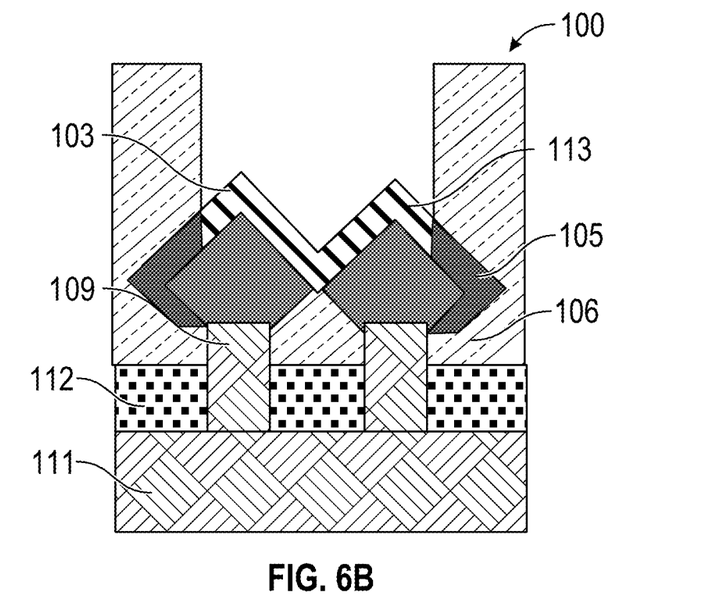

FIGS. 6A-6B illustrate partial cross sectional views of the semiconductor device 100 during a next stage of fabrication, after performing a ESL etching process, in accordance with an embodiment of the present invention. FIG. 6A illustrates a cutline similar to FIG. 1A while FIG. 6B illustrates a cutline similar to FIG. 1B.

The ESL etching process includes performing a plasma etching process using an etching gas that removes the ESL 105 and forms a sacrificial oxide capping layer 113 on the source/drain region. During the plasma etching process, once the ESL 105 is removed and the epitaxial region 103 is exposed, the presence of an oxygen-containing gas in the etching gas reacts with the epitaxial region 103 to form the thin sacrificial capping layer 113 on the epitaxial region 103. The presence of the thin sacrificial capping layer 113 protects the epitaxial region 103 from plasma damage by other reactive gases in the etching gas. The ESL etching process is performed until the ESL 105 is fully removed from the semiconductor device 100. This requires protection of the epitaxial region 103 by the sacrificial oxide capping layer 113, since the ESL etching process may be performed to remove the remaining ESL 105 from other regions than the epitaxial region 103. The sacrificial oxide capping layer 113 is resistant to the other reactive gases in the etching gas. The protection of the epitaxial region 103 prevents or reduces material loss, chemical doping, and bulk crystal structure damage of the epitaxial region 103. In some embodiments, the sacrificial oxide capping layer 113 contains $SiO_2$, $GeO_2$, or $SiGeO_x$.

In various embodiments, the sacrificial capping layer 113 may have a thickness ranging from 0.5 nm to about 5 nm on the top of the epitaxial region 103. In one embodiment, the sacrificial capping layer 113 may have a thickness ranging from 1 nm to about 3 nm, and can be about 2 mn.

In various embodiments, the etching gas in the ESL etching process can contain a fluorocarbon-containing gas and an oxygen-containing gas. The etching gas can further include argon (Ar) gas as a diluent gas. The fluorocarbon-containing gas can include a fluorocarbon gas, a hydrofluorocarbon gas, or a combination thereof. Fluorocarbon gases have a chemical formula of $C_xX_y$, where C and X denote carbon and a halogen, respectively, and x and y are integers. Hydrofluorocarbon gases have a chemical formula of $C_xX_yH_z$ where C, X, and H denote carbon, a halogen, and hydrogen, respectively, and x, y, and z are integers. The oxygen-containing gas can, for example, include $O_2$, $O_3$, CO, $CO_2$, $SO_2$, or a combination thereof.

In one example, the etching gas includes $CH_3F$, $O_2$, and Ar. Exemplary gas flows include about 10-100 sccm of $CH_3F$, about 10-100 sccm of $O_2$, and about 50-200 sccm of Ar. In one example, the plasma etching process may be performed in a processing chamber containing an upper electrode and a lower electrode, where the lower electrode supports a substrate to be processed. Exemplary processing conditions can include a substrate temperature of about 20-100° C., a gas pressure between of about 5-100 mTorr, about 50-500 W of RF power to the upper electrode, and about 50-500 W of RF power to the lower electrode.

Figure 7A:
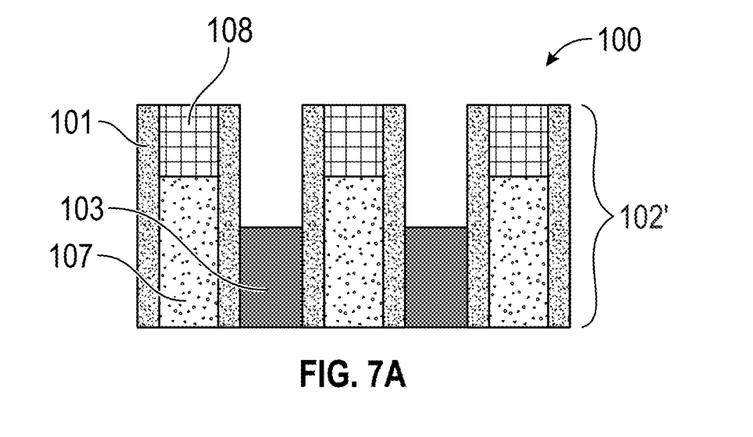
FIGS. 7A-7B illustrate cross sectional fin and gate views respectively of the semiconductor device during a subsequent stage of fabrication, in accordance with an example embodiment of the present disclosure.
Figure 7B:
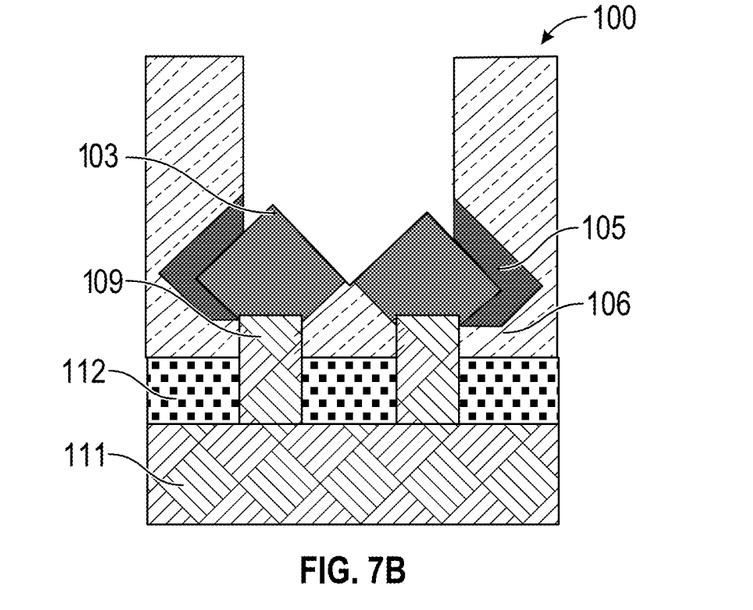

FIGS. 7A-7B illustrate partial cross sectional views of the semiconductor device 100 during a next stage of fabrication, after removing the sacrificial oxide capping layer from the source/drain region, in accordance with an embodiment of the present invention. FIG. 7A illustrates a cutline similar to FIG. 1A while FIG. 7B illustrates a cutline similar to FIG. 1B.

The removal of the sacrificial capping layer 113 may be performed by an etching process, for example dry etching or wet etching, that is efficient and does not damage the epitaxial regions 103. In one example, wet etching can include exposing the substrate to dilute hydrofluoric acid (DHF). In one example, dry etching can include a chemical oxide removal process (COR) that includes exposing the substrate to HF gas and $NH_3$ gas, followed by a heat-treatment that desorbs reaction byproducts from the substrate.

Figure 8A:
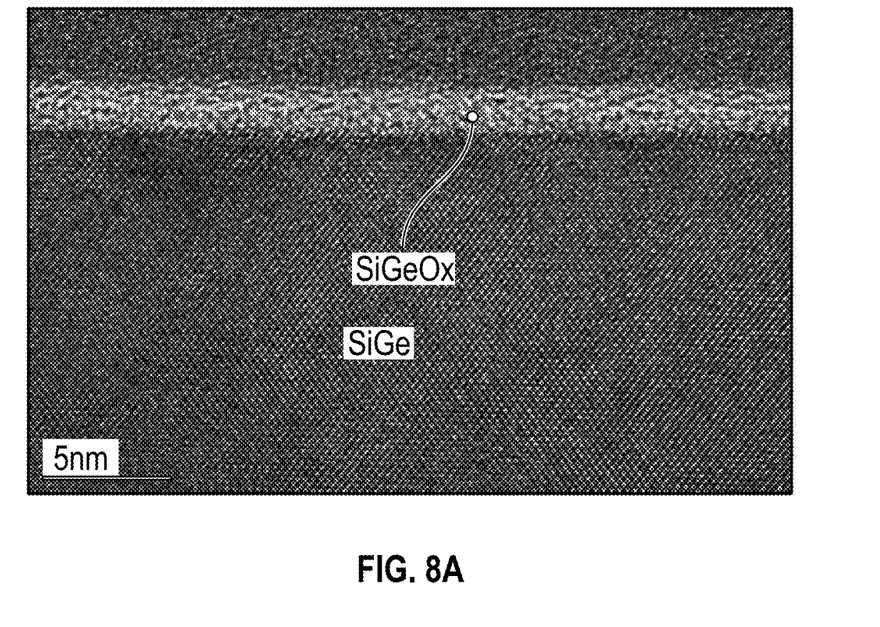
FIGS. 8A-8B show experimental results for processing a substrate according to embodiments of the invention in comparison to conventional a method.
Figure 8B:
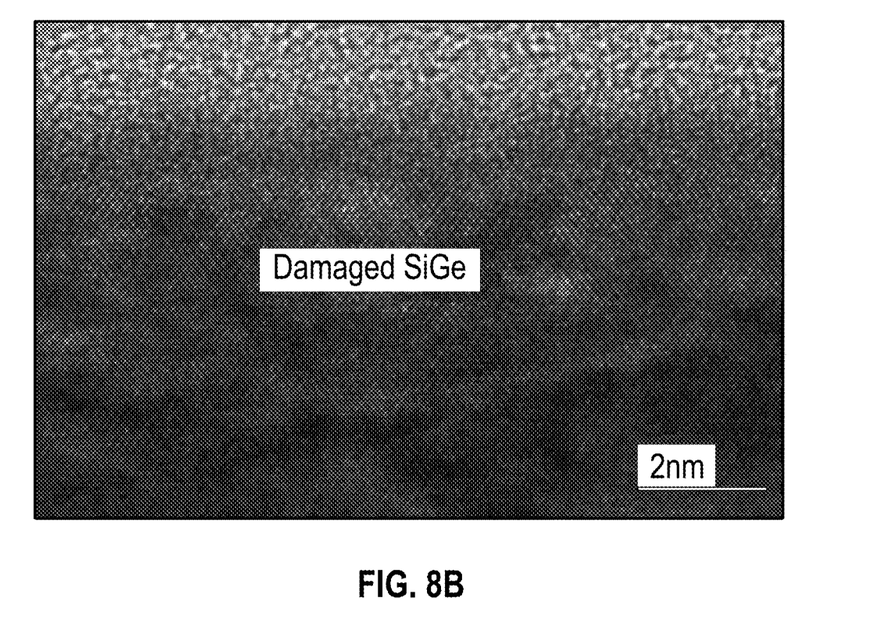

FIGS. 8A-8B show experimental results for processing a substrate according to embodiments of the invention. FIG. 8A shows a transmission electron microscopy (TEM) image following removal of a SiN ESL from a SiGe substrate using a plasma-excited etching gas containing $CH_3F$, $O_2$, and Ar. A sacrificial capping layer containing $SiGeO_x$ and having a thickness of about 2 nm was formed on the SiGe substrate following the removal of the SiN ESL. The TEM in FIG. 8A clearly shows that the crystal structure of the SiGe substrate is not damaged by the plasma etching process. In contrast, FIG. 8B shows a TEM following removal of a SiN ESL from a SiGe substrate using a plasma-excited etching gas containing $CH_3F$, $H_2$, and Ar. Since there is no oxygen-containing gas in the etching gas, a sacrificial capping layer was not formed on the SiGe substrate following the removal of the SiN ESL. The TEM in FIG. 8B clearly shows that the crystal structure of the SiGe substrate is seriously damaged by the plasma etching process. Chemical analysis further showed high levels of hydrogen incorporation in the SiGe substrate. Thus, the results in FIGS. 8A-8B clearly show how a sacrificial capping layer can protect the crystal structure of a SiGe substrate in a semiconductor device.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method comprising:
   providing a substrate comprising an epitaxial source/drain region and an etch stop layer on the epitaxial source/drain region;
   performing a plasma etching process using an etching gas that removes the etch stop layer and forms a sacrificial oxide capping layer on the epitaxial source/drain region; and
   removing the sacrificial oxide capping layer from the epitaxial source/drain region using an etch process that does not damage the epitaxial source/drain region under the sacrificial oxide capping layer.

2. The method of claim 1, wherein:
   the substrate comprises a metal gate stack separated from the source/drain region by a spacer, and
   the etch stop layer is a conformal layer having a first portion covering the epitaxial source/drain region and a second portion covering the spacer and the metal gate stack.

3. The method of claim 2, wherein:
   the performing a plasma etching process comprises completely removing the first portion of the etch stop layer to expose the epitaxial source/drain region before completely removing the second portion of the etch stop layer, and
   forming the sacrificial oxide capping layer on the exposed epitaxial source/drain region while completely removing the second portion of the etch stop layer.

4. The method of claim 1, wherein the epitaxial source/drain region contains Si, Ge, or both Si and Ge.

5. The method of claim 1, wherein the performing a plasma etching process comprises forming a sacrificial oxide capping layer comprising $SiO_2$, $GeO_2$, or $SiGeO_x$.

6. The method of claim 1, wherein the etch stop layer contains a nitride layer.

7. The method of claim 1, wherein the etch stop layer contains SiN.

8. The method of claim 1, wherein the performing a plasma etching process comprises using an etching gas comprising a fluorocarbon-containing gas and an oxygen-containing gas.

9. The method of claim 8, wherein the fluorocarbon-containing gas comprises a fluorocarbon gas, a hydrofluorocarbon gas, or a combination thereof.

10. The method of claim 8, wherein the oxygen-containing gas comprises $O_2$, $O_3$, CO, $CO_2$, $SO_2$ or a combination thereof.

11. The method of claim 1, wherein the removing the sacrificial oxide capping layer comprises performing a wet etch process on the substrate.

12. The method of claim 1, wherein the removing the sacrificial oxide capping layer performing a dry etch process on the substrate.

13. A method comprising:
   providing a substrate comprising and epitaxial source/drain region and a SiN etch stop layer on the epitaxial source/drain region, the epitaxial source/drain region containing Si, Ge, or both Si and Ge;
   performing a plasma etching process using an etching gas containing a fluorocarbon-containing gas and an oxygen-containing gas that removes the SiN etch stop layer and forms a sacrificial oxide capping layer on the epitaxial source/drain region; and
   removing the sacrificial oxide capping layer from the epitaxial source/drain region using a wet or dry etch process that does not damage the epitaxial source/drain region under the sacrificial oxide capping layer.

14. The method of claim 13, wherein:
   the substrate comprises a metal gate stack separated from the epitaxial source/drain region by a spacer, and
   the SiN etch stop layer is a conformal layer having a first portion covering the epitaxial source/drain region and a second portion covering the spacer and the metal gate stack.

15. The method of claim 14, wherein
   the performing a plasma etching process comprises completely removing the first portion of the etch stop layer to expose the epitaxial source/drain region before completely removing the second portion of the etch stop layer, and
   forming the sacrificial oxide capping layer on the exposed epitaxial source/drain region while completely removing the second portion of the etch stop layer.

16. The method of claim 13, wherein the sacrificial oxide capping layer contains $SiO_2$, $GeO_2$, or $SiGeO_x$.

17. The method of claim 13, wherein the fluorocarbon-containing gas includes a fluorocarbon gas, a hydrofluorocarbon gas, or a combination thereof.

18. The method of claim 13, wherein the oxygen-containing gas includes $O_2$, $O_3$, CO, $CO_2$, $SO_2$, or a combination thereof.

19. A method comprising:
   providing a substrate comprising an epitaxial source/drain region and a SiN etch stop layer on the epitaxial source/drain region, the epitaxial source/drain region containing Si, Ge, or both Si and Ge;
   performing a plasma etching process using an etching gas containing $CH_3F$ gas and $O_2$ gas that removes the SiN etch stop layer and forms a sacrificial oxide capping layer on the epitaxial source/drain region, the sacrificial oxide capping layer containing $SiO_2$, $GeO_2$, or $SiGeO_x$; and removing the sacrificial oxide capping layer from the epitaxial source/drain region using a wet or dry etch process that does not damage the epitaxial source/drain region under the sacrificial oxide capping layer.

20. The method of claim 19, wherein:

the substrate comprises a metal gate stack separated from the epitaxial source/drain region by a spacer;

the SiN etch stop layer is a conformal layer having a first portion covering the epitaxial source/drain region and a second portion covering the spacer and the metal gate stack;

the performing a plasma etching process comprises completely removing the first portion of the etch stop layer to expose the epitaxial source/drain region before completely removing the second portion of the etch stop layer, and forming the sacrificial oxide capping layer on the exposed epitaxial source/drain region while completely removing the second portion of the etch stop layer.

* * * * *

UNITED STATES PATENT AND TRADEMARK OFFICE
CERTIFICATE OF CORRECTION

| | | |
|---|---|---|
| PATENT NO. | : 12,266,533 B2 | Page 1 of 1 |
| APPLICATION NO. | : 17/721620 | |
| DATED | : April 1, 2025 | |
| INVENTOR(S) | : Han et al. | |

It is certified that error appears in the above-identified patent and that said Letters Patent is hereby corrected as shown below:

On the Title Page

Item (57), under "Abstract", Line 6, delete "from" and insert -- formed on --, therefor.

In the Claims

In Column 10, Claim 10, Line 11, delete "$SO_2$or" and insert -- $SO_2$, or --, therefor.

In Column 10, Claim 12, Line 17, delete "layer" and insert -- layer comprises --, therefor.

Signed and Sealed this
Fourth Day of November, 2025

John A. Squires
*Director of the United States Patent and Trademark Office*